United States Patent
Reykowski

(10) Patent No.: US 9,124,218 B2
(45) Date of Patent: Sep. 1, 2015

(54) INPUT IMPEDANCE OF LOW NOISE PREAMPLIFIERS USED FOR MRI WITH DUAL SOURCE FET, FLOATING GROUND AND PERMANENT GROUND

(75) Inventor: Arne Reykowski, Gainesville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 790 days.

(21) Appl. No.: 13/375,490

(22) PCT Filed: May 17, 2010

(86) PCT No.: PCT/IB2010/052178
§ 371 (c)(1),
(2), (4) Date: Dec. 1, 2011

(87) PCT Pub. No.: WO2010/146486
PCT Pub. Date: Dec. 23, 2010

(65) Prior Publication Data
US 2012/0062233 A1  Mar. 15, 2012

Related U.S. Application Data

(60) Provisional application No. 61/218,490, filed on Jun. 19, 2009.

(51) Int. Cl.
*H03F 1/10* (2006.01)
*H03F 3/193* (2006.01)
*H03F 1/08* (2006.01)

(52) U.S. Cl.
CPC ............ *H03F 1/086* (2013.01); *H03F 1/10* (2013.01); *H03F 3/193* (2013.01)

(58) Field of Classification Search
USPC .......................... 324/300–322; 600/407–435; 382/128–131; 250/352; 327/355, 503; 330/263, 267; 360/46; 365/209, 210
See application file for complete search history.

(56) References Cited

U.S. PATENT DOCUMENTS

| 3,381,238 A | 4/1968 | Barton et al. |
| 4,075,576 A * | 2/1978 | Eden .............................. 330/277 |

(Continued)

FOREIGN PATENT DOCUMENTS

| GB | 2161046 A | 1/1986 |
| WO | 2008146256 A2 | 12/2008 |
| WO | WO 2008146256 A2 * | 12/2008 |

OTHER PUBLICATIONS

Brummer, H.; Electronische Geratetechnik; 1980; Vogel-Verlag; pp. 224-227.

*Primary Examiner* — Dixomara Vargas
*Assistant Examiner* — Tiffany Fetzner

(57) ABSTRACT

A preamplifier (46) comprises a field effect transistor (64) in common source configuration. While the gate of the field effect transistor is coupled to an amplifier input circuit (e.g. MRI coil), the drain of the field effect transistor (64) is coupled to an amplifier output. The preamplifier comprises furthermore a first (66) and a second (68) source-ground connection. The first source-ground lead (66) couples the source of the field effect transistor to the ground node of the amplifier input circuit, while the second source-ground lead (68) couples the source of the field effect transistor to the ground node of the amplifier output circuit. As a result, amplifier output currents generate basically a voltage drop across the second source-ground lead (68). Thus, the amplifier input circuit is less influenced by any common voltage drop across any common source-ground connection.

20 Claims, 4 Drawing Sheets

(56) References Cited

U.S. PATENT DOCUMENTS

| | | | |
|---|---|---|---|
| 4,126,823 A * | 11/1978 | Dalton, Jr. | 324/301 |
| 4,163,197 A * | 7/1979 | Sampei | 330/263 |
| 4,260,949 A * | 4/1981 | Dalton, Jr. | 324/302 |
| 4,435,846 A * | 3/1984 | Weise | 455/234.2 |
| 4,689,563 A * | 8/1987 | Bottomley et al. | 324/309 |
| 4,694,254 A * | 9/1987 | Vatis et al. | 324/309 |
| 4,835,485 A * | 5/1989 | Mueller | 330/277 |
| 4,839,594 A | 6/1989 | Misic et al. | |
| 4,862,002 A * | 8/1989 | Wang et al. | 250/352 |
| 4,882,504 A * | 11/1989 | Petitjean et al. | 327/503 |
| 5,296,813 A | 3/1994 | Holmes et al. | |
| 5,545,999 A | 8/1996 | Mueller et al. | |
| 6,639,310 B2 | 10/2003 | Takikawa et al. | |
| 6,677,755 B2 * | 1/2004 | Belt et al. | 324/322 |
| 6,870,696 B2 * | 3/2005 | Cheung et al. | 360/46 |
| 6,897,658 B2 * | 5/2005 | Belt et al. | 324/322 |
| 6,990,030 B2 * | 1/2006 | Lemus et al. | 365/209 |
| 8,324,900 B2 * | 12/2012 | Helvoort et al. | 324/322 |
| 8,933,745 B2 * | 1/2015 | Wu et al. | 327/355 |
| 2003/0117140 A1 * | 6/2003 | Belt et al. | 324/322 |
| 2004/0090233 A1 * | 5/2004 | Belt et al. | 324/322 |
| 2005/0083748 A1 * | 4/2005 | Lemus et al. | 365/210 |
| 2010/0164498 A1 * | 7/2010 | Helvoort et al. | 324/322 |
| 2012/0062233 A1 * | 3/2012 | Reykowski | 324/322 |

\* cited by examiner

INPUT IMPEDANCE OF LOW NOISE PREAMPLIFIERS USED FOR MRI WITH DUAL SOURCE FET, FLOATING GROUND AND PERMANENT GROUND

CROSS REFERENCE TO RELATED APPLICATIONS

This application claims the benefit of U.S. provisional application Ser. No. 61/218,490 filed Jun. 19, 2009, which is incorporated herein by reference.

The present application finds particular utility in medical imaging systems. However, it will be appreciated that the described technique(s) may also find application in other types of imaging systems, other systems in which input impedance modification is desirable, and/or other applications in which preamplifiers are employed.

In magnetic resonance imaging, surface or local receive coils output very weak signals which are easily contaminated by noise or feedback. Ideally, on the local receive coil, the matching network should interface with a very high or infinite impedance. On the other hand, it is desirable for the preamp on the local receive coil input to see a relatively low impedance.

Inside the preamp, the input impedance is defined through the active gate-source impedance of an FET device. When the source ground is connected with the preamp ground and the RF coil ground, a feedback loop is formed. This feedback loop adversely affects the MR signal from the coil.

Low-noise preamplifiers for magnetic resonance imaging (MRI) systems are designed to have a minimum noise figure combined with a large impedance mismatch between the signal source (MRI antenna) and the preamp input. The large impedance mismatch (e.g., approximately 1:50) is used to reduce currents on the antenna and thereby mitigate the negative effects of mutual inductance in an array of MRI coils.

Classical preamplifier designs use field effect transistor (FET) devices that usually have a highly reactive (capacitive) gate. The resistive component of the FET gate is partially due to losses in the gate capacitance and partially due to series voltage feedback of the amplified signal. This feedback is a result of the finite impedance of the source bonding wire and connected PCB trace, which causes a voltage drop from the drain-source current that effectively changes the gate-source input voltage.

There is an unmet need in the art for systems and methods that facilitate reducing the series voltage feedback due to the bond wires and thereby improving the impedance mismatch ratio of the preamplifier, and the like, thereby overcoming the deficiencies noted above.

In accordance with one aspect, a preamplifier device with a FET device includes a gate, a drain, a first source connected to a floating ground, and a second source coupled to a second ground.

In accordance with another aspect, a method of reducing input impedance in a FET preamplifier device includes isolating a first source from a second source using a first source first source resistance and a first source impedance in the first source, and a second source resistance and a second source impedance in the second source, such that amplified power flows only between a drain and the second source and does not increase impedance at a gate at the input side of the preamplifier. The method further includes connecting the first source to a floating ground, and connecting the second source to a system ground.

One advantage is that voltage feedback is reduced.

Another advantage resides in improving the input-output impedance ratio.

Still further advantages of the subject innovation will be appreciated by those of ordinary skill in the art upon reading and understanding the following detailed description.

The drawings are only for purposes of illustrating various aspects and are not to be construed as limiting.

In accordance with various features presented herein, systems and methods are described that facilitate mitigating voltage feedback seen at a preamp input by employing two bond wires in the source contact. One bond wire connects a magnetic resonance coil ground and the other source bond wire connects with a preamp ground. Each of the bond wires has an inherent inductance and resistance. In this manner, the RF coil has a floating ground that eliminates a voltage drop across the input terminals that receive the output from the magnetic resonance coil. Although the innovation is described herein in the context of a feedback problem in local magnetic resonance coils, the concept is also applicable to any other applications in which separate input and output ground connections are appropriate and in which it is desirable to minimize voltage feedback to the input.

Figure 1:
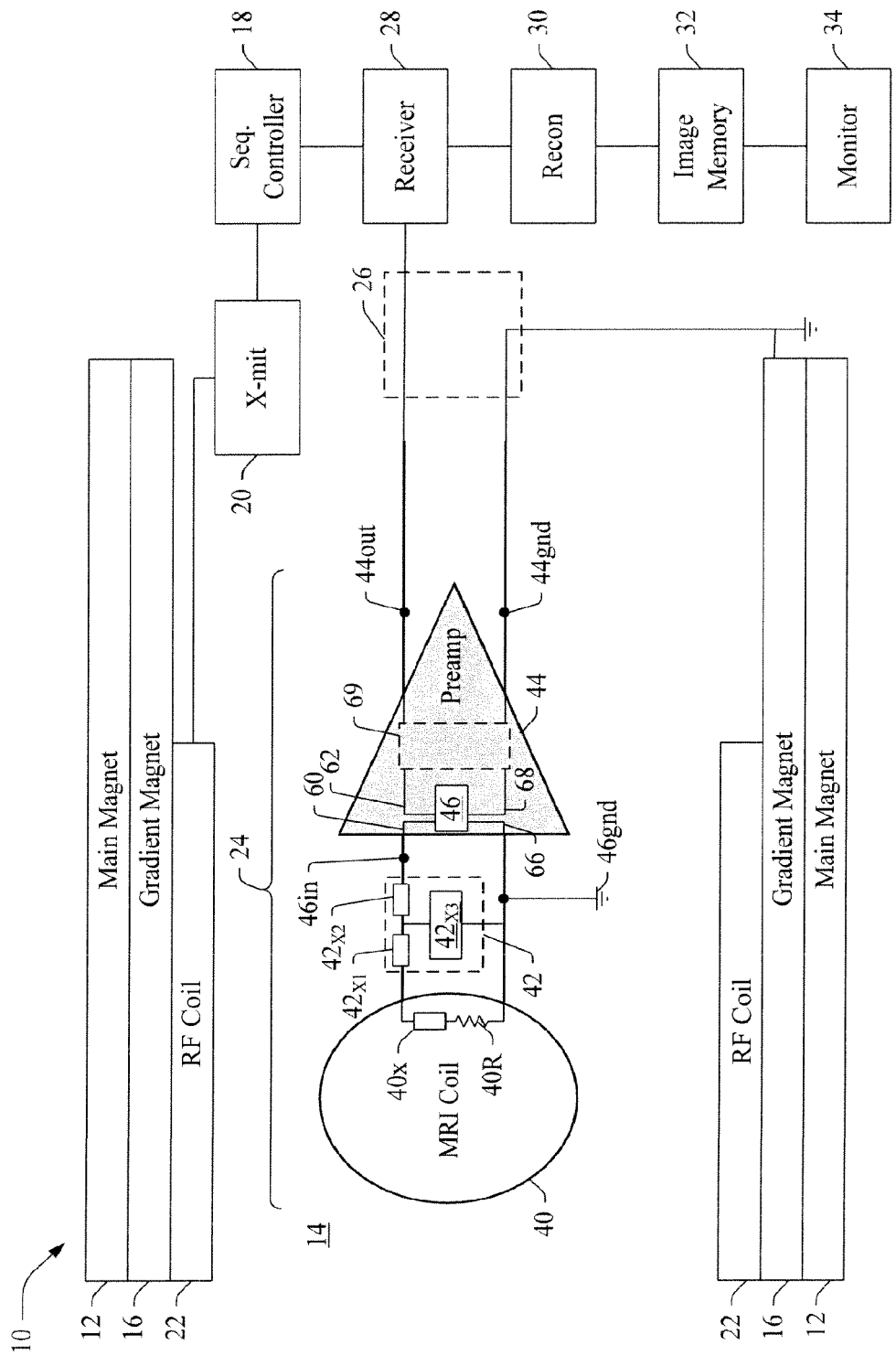
FIG. 1 illustrates a magnetic resonance imaging system.

With reference to FIG. 1, an MRI system 10 includes a main magnet 12 that generates a temporally constant main or B0 magnetic field through an examination region 14. A gradient magnet 16 generates gradient magnetic fields across the examination region under control of a sequence controller 18. The sequence controller also controls an RF transmitter 20 to cause an RF coil 22 to generate B1 fields to excite and manipulate resonances.

Induced resonance signal are received by a surface or local receive coil assembly 24 which is connected by a lead or cable 26 to a receiver 28 of the MRI system 10. A reconstruction processor 30 reconstructs MR signals received by the local coil assembly 24 into an image representation that is stored in an image memory 32, displayed on a monitor 34, or the like.

The local coil assembly 24 includes one or more coils 40 which has a reactance 40x and a resistance $40_R$. A matching circuit 42 includes a plurality of reactances $42_{X1}$, $42_{X2}$, and $42_{X3}$, e.g. connected as a T-network. The matching circuit 42 connects the coil 40 to a preamplifier 44 which has an FET device 46 at an input stage between a coil input 46in and a floating coil ground 46gnd. The preamplifier 44 has an output 44out connected via the lead 26 to the receiver 28 and an output ground 44gnd connected via the lead to the system ground of the receiver etc. The FET device includes a gate 60, a drain 62, a first source 66, and a second source 68. Optionally, the preamplifier includes additional amplifier stages 69 and the like. It will be understood that "sources" 66, 68 refer to source connections or pins on the FET device.

Figure 2:
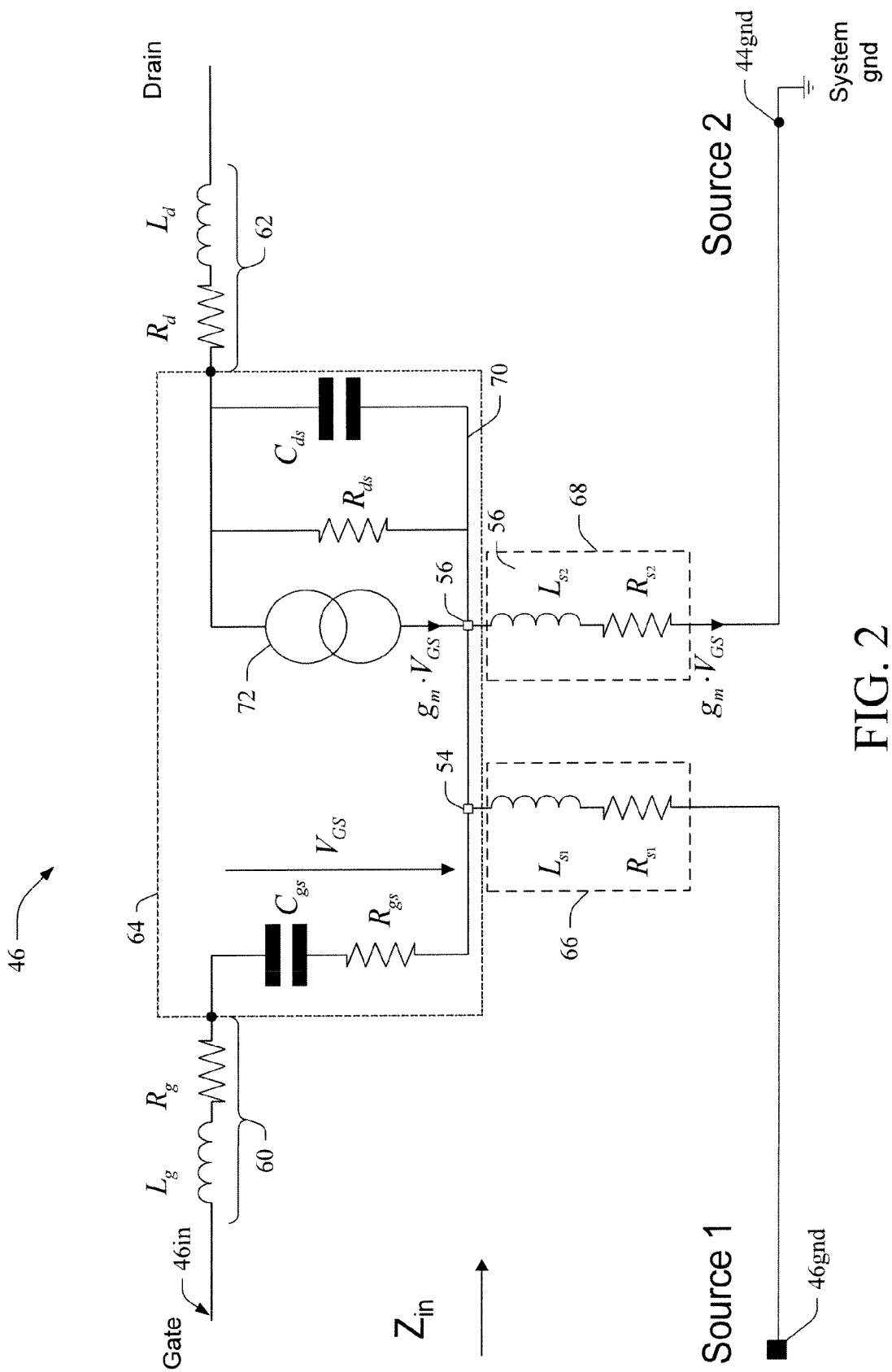
FIG. 2 illustrates a preamplifier circuit FET device that includes a gate and a drain coupled to a chip having first and second source connections.

FIG. 2 illustrates the preamplifier circuit FET device 46 that includes a gate 60 connected to the input 46in and a drain 62 coupled to a device chip 64. The chip has a first source 66 coupled to the local coil ground 46gnd and a second source 68 connected to the output or system ground 44gnd. The gate 60 inherently has a gate inductance $L_g$ in series with a gate resistance $R_g$. The FET device has a gate-to-source capacitance $C_{gs}$ between the gate and the source. The gate-to-source capacitance $C_{gs}$ is coupled in series with a gate-to-source resistance $R_{gs}$, which is coupled to a bus 70. A gate-to-source voltage $V_{gs}$ is applied by the coil 40 (FIG. 1) across the gate to source capacitance $C_{gs}$ and resistance $R_{gs}$.

The drain defines a drain inductance $L_d$ series with a drain resistance $R_d$ which is coupled to a drain-to-source capacitance $C_{ds}$, a drain-to-source resistance $R_{ds}$, and a constant direct current source 72, which are coupled to the bus 70 in a parallel arrangement relative to each other. The current source 72 supplies a current defined by $g_m * V_{gs}$, where $g_m$ is a mutual transductance.

Also coupled to the bus 70 are the first source 66 and the second source 68. The first source connection has a source inductance $L_{S1}$ in series with a first source resistance $R_{S1}$. The first source is connected with the floating ground, e.g., the local coil ground 46gnd. The second source 20 includes a second source inductive component $L_{S2}$ in series with a second source resistance $R_{S2}$. The second source couples the bus 70 to the system ground.

Each of the floating ground 46gnd and the system ground 44gnd (e.g., first and second FET sources) are each coupled to the bus 70 via separate bonding wires, thereby isolating the input of the preamp from unwanted voltage feedback. In one embodiment, the chip 64 includes two (or more) pins 54, 56 coupled to the bus 70, to which the two separate sources are coupled. Connecting one source pin (e.g., pin 54) to the input ground 46gnd of the amplifier and a second source pin (e.g., pin 56) to the output ground 44gnd of the device reduce the series voltage feedback when both grounds are kept separate. Keeping the grounds separate is facilitated in MRI coil designs because each local coil is allowed to have a "floating ground" with respect to any other component in the circuitry. In another embodiment, input and output grounds can be isolated from each other by using a "balun" (balanced-to-unbalanced) device.

The FET device with at least two separate source connections on the device package is employed such that at least one of the source pins is connected to the input ground 46gnd of the preamplifier, and at least one other of the source pins is connected to the output ground 44gnd of the preamplifier. The input and output grounds of the preamplifier are thus kept separate (isolated) from each other by the resistances $R_{S1}$ and $R_{S2}$ and the inductances $L_{S1}$ and $L_{S2}$. In this manner, amplified power flows only between the drain 62 and the second (output-side) source 68, which minimizes feedback to the input side of the preamplifier.

The FET device can be employed in local MRI or MR spectroscopy coils including low noise preamplifiers with a high impedance mismatch between the coil 40 and the preamplifier 44. In another embodiment, the FET device can be used in radio astronomy applications using tightly spaced, and therefore coupled, arrays of antennas. According to another embodiment, the FET device can be employed in any application requiring high impedance mismatch between a source and a preamplifier.

According to one embodiment, the impedance caused by the transductance $g_m$ at the input side of the preamplifier is reduced or eliminated by decoupling the input and output sources. For instance, in a classical preamplifier arrangement, the input impedance may be defined as:

$$Z_{in} = \left(R_g + R_{gs} + R_s + g_m * \frac{L_s}{C_{gs}}\right) + j\left(\omega L_s + \omega L_g - \frac{1}{\omega C_{gs}}\right).$$

By isolating the input and output sources (e.g., grounds), the impedance due to the transductance $g_m$ is seen only at the output side of the preamplifier, such that the input impedance is defined as:

$$Z_{in} = (R_g + R_{gs} + R_{s1}) + j\left(\omega L_{s1} + \omega L_g - \frac{1}{\omega C_{gs}}\right).$$

In this manner, the resistive component of the input impedance is reduced thereby improving the mismatch ratio between coil and preamplifier. That is, the voltage drop $V_{gs}$ across the input is greatly reduced or removed, thereby improving the impedance ratio between the input and output of the preamplifier.

Figure 3:
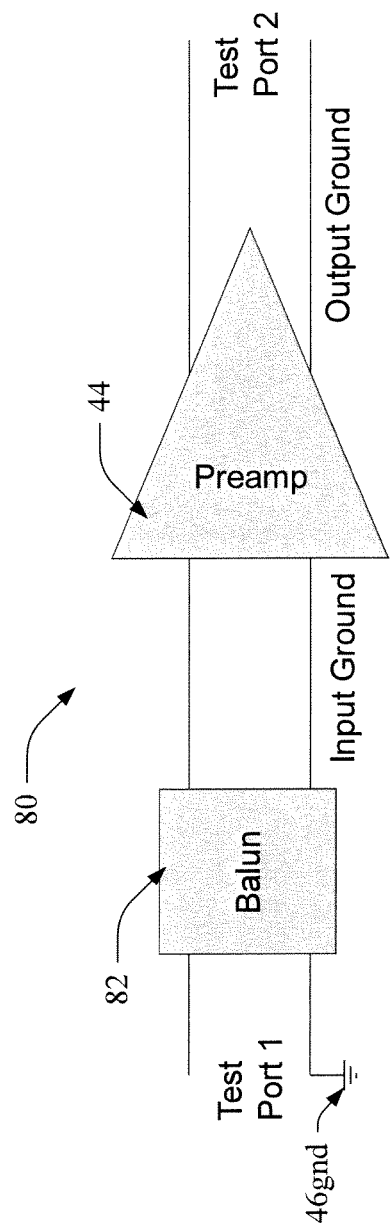
FIG. 3 illustrates a preamplifier arrangement wherein a balun is coupled to a preamplifier, such as for a test setup for determining scattering parameters and/or impedance matrix.

FIG. 3 illustrates a preamplifier arrangement 80 wherein a balun 82 is coupled to the preamplifier 44, such as for a test setup for determining the scattering parameters. The balun is coupled to a first test port and to the preamplifier by first and second connections, one of which is an input ground 46gnd. The preamplifier is further coupled to a second test port by a pair of connections, one of which is an output ground 44gnd. In this manner, the input and output grounds are isolated from each other, thereby ensuring that amplified power flows only from the drain of the preamplifier to the output. Input impedance is protected from unwanted feedback and the impedance ratio across the preamplifier is improved.

Figure 4:
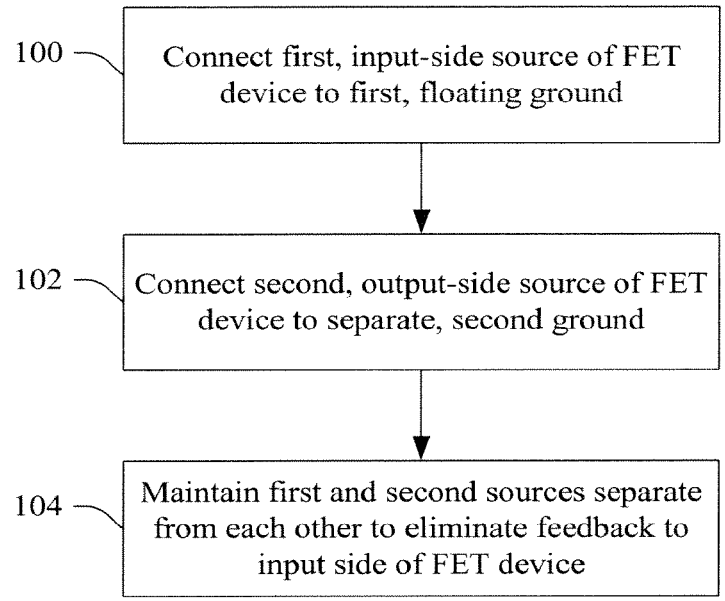
FIG. 4 illustrates a method of improving an input-output impedance ratio for a preamplifier (e.g., a FET device), in accordance with various aspects described herein.

FIG. 4 illustrates a method of increasing the impedance mismatch between the coil and the preamplifier (e.g., a FET device), in accordance with various aspects described herein. At 100, an input-side source of a preamplifier FET device is coupled to a floating ground. In one embodiment, the floating ground is a local coil or antenna of an MR device. At 102, an output-side source is coupled to a second ground, separate and isolated from the floating ground, e.g. the system ground. At 104, the input-side and output-side sources are kept separate to eliminate feedback to the input side of the FET device. In this manner, impedance at the input side is reduced, increasing the impedance mismatch between the coil and the preamplifier.

Figure 5:
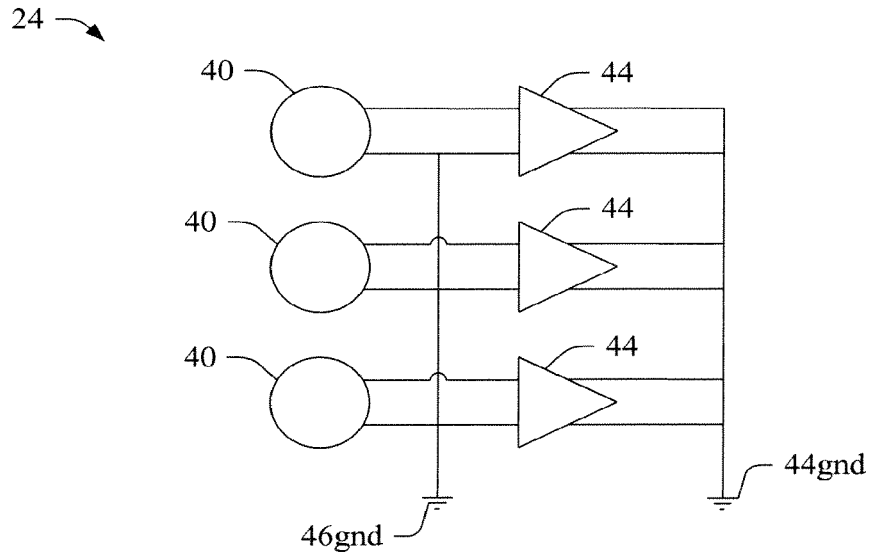
FIG. 5 illustrates an antenna array comprising a plurality of antennas closely arranged, each antenna being coupled to a dedicated FET preamplifier device, in accordance with various aspects described herein.

FIG. 5 illustrates an embodiment of the coil array 24 comprising a plurality of coils 40 closely arranged, each coil being coupled to a dedicated FET preamplifier device 44, in accordance with various aspects described herein. The FET devices facilitate reducing voltage feedback from an output side of the FET to an input side thereof, and may be employed in any tightly spaced and/or coupled antenna array, such as those used for radio astronomy applications or the like.

The innovation has been described with reference to several embodiments. Modifications and alterations may occur to others upon reading and understanding the preceding detailed description. It is intended that the innovation be construed as including all such modifications and alterations insofar as they come within the scope of the appended claims or the equivalents thereof.

Having thus described the preferred embodiments, the invention is now claimed to be:

1. A preamplifier device, comprising:
   a field effect transistor (FET) device configured to receive a signal input to the preamplifier device, the FET device itself comprising:

a single gate;
a single drain;
a first source of the FET device coupled to a floating ground; and
a second source of the FET device coupled to a second ground.

2. The preamplifier device according to claim 1, wherein:
the single gate of the FET device has a gate reactance $L_g$ and a gate resistance $R_g$;
the single drain of the FET device has a drain reactance $L_d$ and a drain resistance $R_d$;
the first source of the FET device has a first source reactance $L_{s1}$ and a first source resistance $R_{s1}$; and
the second source of the FET device has a second source reactance $L_{s2}$ and a second source resistance $R_{s2}$.

3. The preamplifier device according to claim 2, wherein the first source and the second source of the FET device are both isolated from each other as a result of the first source resistance $R_{s1}$, the second source resistance $R_{s2}$, the first source reactance $L_{s1}$, and the second source reactance $L_{s2}$ being included.

4. The preamplifier device according to claim 2 wherein the FET device has a gate-to-source capacitance and a gate-to-source resistance, which are coupled in series between the single gate of the FET device and the first and second sources of the FET device.

5. The preamplifier device according to claim 4, wherein the FET device has a drain-to-source capacitance, a drain-to-source resistance, and a direct current source coupled in parallel between the single drain of the FET device and the first and second sources of the FET device.

6. The preamplifier device according to claim 1, wherein amplified power flows between the single drain of the FET device and the second source of the FET device, on an output side of the preamplifier device, and the amplified power flow does not modify impedance occurring on the input side of the preamplifier device.

7. A coil assembly including:
a coil coupled to the single gate of the FET device and first source of the FET device according to claim 1, wherein the floating ground of the FET device is a ground of the coupled coil.

8. An MR (magnetic resonance) device comprising:
a main magnet that generates a temporally constant B0 magnetic field through an examination region;
a gradient magnet that generates gradient magnetic fields across the examination region;
an RF transmitter and an RF coil that generate B1 fields across the examination region; and
wherein the main magnet, the gradient magnet, the RF transmitter, and the RF coil are coupled to the coil assembly according to claim 7.

9. The MR device according to claim 8,
wherein the main magnet, the gradient magnet, the RF transmitter, and the RF coil are further coupled to:
a plurality of additional coil assemblies, wherein each coil assembly in the plurality of additional coil assemblies, is respectively coupled to a corresponding single gate and first source of an individual FET device.

10. The MR device according to claim 8, further including:
a lead that connects the preamplifier to a receiver; and
also connects the second source of the FET device with a system ground of the receiver.

11. The preamplifier device according to claim 1, wherein the preamplifier device is employed in an antenna array.

12. The preamplifier device according to claim 11, wherein the antenna array itself is a radio-astronomy antenna array.

13. A method of reducing input impedance to the preamplifier device of claim 2, including:
isolating the first and second sources of the FET device from each other, as a result of the first source resistance, the second source resistance, the first source impedance, and the second source impedance being included.

14. A method of reducing input impedance in a preamplifier device, which includes a field effect transistor (FET), the method comprising:
isolating a first source of the FET from a second source of the FET by using a first source resistance and a first source impedance at the first source of the FET and a second source resistance and a second source impedance at the second source of the FET, such that amplified power flows only between a single drain of the FET and the second source of the FET and the amplified power flow does not increase impedance occurring at a single gate of the FET that is located at the input side of the preamplifier;
connecting the first source of the FET electrically or mechanically to a floating ground; and
connecting the second source of the FET electrically or mechanically to a system ground.

15. The method according to claim 14, further including:
providing a gate reactance $L_g$ and a gate resistance $R_g$ at the single gate of the FET; and
providing a drain reactance $L_d$ and a drain resistance $R_d$ at the single drain of the FET.

16. The method according to claim 14, wherein the FET has a gate-to-source capacitance and a gate-to-source resistance, that is coupled in series between the single gate of the FET and the first and second sources of the FET itself.

17. The method according to claim 14, wherein the FET has a drain-to-source capacitance, a drain-to-source resistance, and a direct current source coupled in parallel between the single drain of the FET and the first and second sources of the FET itself.

18. The method according to claim 14, further including:
coupling a coil to both the single gate of the FET and first source of the FET, wherein the floating ground of the FET is also a ground of the coil.

19. The preamplifier device according to claim 1, wherein the first source and the second source of the FET device are isolated from each other, thereby isolating an input into the preamplifier device from unwanted voltage feedback.

20. A preamplifier device, comprising:
an input side configured for receiving an input signal;
an output side configured for outputting an amplified output signal; and
a field effect transistor (FET) device, comprising:
a single gate;
a single drain;
a first source, wherein a first bond wire couples the first source of the FET device to a floating input ground on the input side of the preamplifier device; and
a second source, wherein a second bond wire couples the second source of the FET device to an output ground on the output side of the preamplifier device, thereby isolating the output ground from the floating input ground of the FET device.

* * * * *